(12) United States Patent
Park et al.

(10) Patent No.: US 7,227,306 B2
(45) Date of Patent: Jun. 5, 2007

(54) ORGANIC ELECTROLUMINESCENCE DISPLAY HAVING RECESSED ELECTRODE STRUCTURE

(75) Inventors: Jin-Woo Park, Yong-si (KR); Jang-Hyuk Kwon, Suwon-si (KR); Moon-Hee Park, Busan (KR); Chang-Su Seo, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/927,197

(22) Filed: Aug. 27, 2004

(65) Prior Publication Data
US 2005/0046342 A1    Mar. 3, 2005

(30) Foreign Application Priority Data
Aug. 28, 2003 (KR) ............. 10-2003-0059992
Nov. 29, 2003 (KR) ............. 10-2003-0086157

(51) Int. Cl.
*H01J 1/62* (2006.01)

(52) U.S. Cl. ...................... 313/506; 313/504
(58) Field of Classification Search ......... 313/504, 313/503, 506
See application file for complete search history.

(56) References Cited

U.S. PATENT DOCUMENTS

| 2004/0056588 | A1* | 3/2004 | Nozawa .............. 313/504 |
| 2004/0256983 | A1* | 12/2004 | Hung et al. ........ 313/506 |
| 2005/0023967 | A1* | 2/2005 | Gotoh et al. ....... 313/504 |
| 2005/0037232 | A1* | 2/2005 | Tyan et al. ........ 428/690 |

FOREIGN PATENT DOCUMENTS

| JP | 05-021158 | 1/1993 |
| JP | 2000-260571 | 9/2000 |

* cited by examiner

Primary Examiner—Joseph Williams
Assistant Examiner—Bumsuk Won
(74) Attorney, Agent, or Firm—H.C. Park & Associates, PLC

(57) ABSTRACT

An organic electroluminescence display capable of increased luminance and luminous efficiency by forming an organic light emitting device in a recessed structure is disclosed. The organic electroluminescence display comprises a pixel defining layer provided with an opening, a first electrode formed on the opening of the pixel defining layer in a recessed structure, an organic emission layer formed on the first electrode, and a second electrode. The organic emission layer is formed to be recessed in the first electrode, so that the first electrode surrounds the organic emission layer.

20 Claims, 5 Drawing Sheets

ORGANIC ELECTROLUMINESCENCE DISPLAY HAVING RECESSED ELECTRODE STRUCTURE

This application claims the benefit of Korean Patent Application No. 2003-59992, filed Aug. 28, 2003, and Korean Patent Application No. 2003-86157, filed Nov. 29, 2003, which are hereby incorporated by reference for all purposes as if fully set forth herein.

BACKGROUND OF THE INVENTION

1. Field of the Invention

The present invention relates to an organic electroluminescence display and, more particularly, to an organic electroluminescence display in which an organic light emitting device is formed in a recessed structure.

2. Discussion of the Related Art

Generally, an electroluminescence display is a self-emissive display that electrically excites a fluorescent compound to emit light. These displays are drawing attention as the next-generation display that can overcome drawbacks associated with liquid crystal displays (LCD) regarding viewing angles and response times, among others. They may also be driven at a lower voltage, and they can be made thinner than LCDs.

Electroluminescence displays are classified as inorganic or organic depending upon whether the material comprising the emission layer is an inorganic or organic compound.

The organic electroluminescence display may have an organic layer formed on a transparent substrate such as glass, and a plurality of electrode layers formed on upper and lower portions of the organic layer.

For the organic electroluminescence display described above, when anode and cathode voltages are applied to the electrodes, holes (acting as mobile positive charge carriers) are injected from the anode electrode, and they migrate to an emission layer (EML) via a hole transporting layer (HTL), while electrons are injected from the cathode electrode, and they migrate to the emission layer via an electron transporting layer (ETL). The electrons and holes combine at the EML to generate exitons. As the exitons change from an excited state into a base state, fluorescent molecules of the emission layer emit light, thereby forming an image.

Active matrix (AM) organic electroluminescence displays include at least two thin film transistors (TFTs) per pixel. One TFT is used for driving the pixel while the other controls the pixel's operation. TFTs are typically comprised of drain and source regions with a high concentration of dopant, a semiconductor active layer having a channel region defined between the drain and source regions, and a gate electrode formed on a gate insulating layer. The gate insulating layer is typically formed on the semiconductor active layer, and the gate electrode is typically formed on the channel region of the active layer.

A conventional organic electroluminescence display will now be described with reference to FIG. 1, which shows a cross-sectional view of a conventional organic electroluminescence display using an inorganic passivation layer.

Referring to FIG. 1, a TFT is formed on a lower insulating substrate 110. The TFT is comprised of an active layer 111, a gate electrode 112 and source/drain electrodes 113S and 113D, and it is electrically coupled to a first electrode 114, which serves as anode.

The first electrode 114 is typically formed by depositing a metal such as Ag or Al having good reflectivity, and depositing and patterning a transparent conductive material such as ITO (indium tin oxide) or IZO (indium zinc oxide) having a high work function, thereby forming a transparent anode electrode with a reflective layer.

A pixel defining layer 115 is then formed on the entire surface of the lower insulating substrate 110 and patterned to form an opening 115a, thereby partially exposing a portion of the first electrode.

An organic emission layer 116 is next formed in the opening 115a.

After forming the organic emission layer 116, a second electrode 117, serving as a cathode electrode, is formed on the entire surface of the lower insulating substrate 110. As a result, an organic light emitting device (OLED) is formed which includes the first electrode 114, the organic emission layer 116, and the second electrode 117.

The second electrode 117 may be formed by depositing a metal such as Al, Ca or Mg having a low work function, and depositing a transparent conductive material such as ITO or IZO.

A second passivation layer 118 is then formed on the entire surface of the substrate.

Finally, an upper insulating substrate 120 is used to encapsulate the lower insulating substrate with the TFT and the OLED.

The space 119 between the upper insulating substrate 120 and the second passivation layer 118 is filled with a gas such as nitrogen ($N_2$) or argon (Ar), or it may be a vacuum. The organic layer is formed by depositing a transparent organic material having the index of refraction of 1.5.

A top-emitting organic electroluminescence display fabricated as described above, however, may lose at least 25% of light because when the light generated at the organic emission layer radiates upward, it is reflected at the interface between the second passivation layer 118 and the second electrode 117, or between the second passivation layer 118 and the space 119 filled with nitrogen. So only 20% of the generated light may be transmitted as a visible image.

SUMMARY OF THE INVENTION

Accordingly, the present invention is directed to an organic electroluminescence display that substantially obviates one or more of the problems due to limitations and disadvantages of the related art.

This invention provides an organic electroluminescence display capable of improving luminous efficiency and luminance by forming an organic light emitting device in a recessed structure.

Additional features of the invention will be set forth in the description which follows, and in part will be apparent from the description, or may be learned by practice of the invention.

The present invention discloses an organic electroluminescence display comprising a pixel defining layer provided with an opening, a first electrode formed on the opening of the pixel defining layer in a recessed structure, an organic emission layer formed on the first electrode, and a second electrode. The organic emission layer is formed to be recessed in the first electrode, so that the first electrode surrounds the organic emission layer.

The present invention also discloses an organic electroluminescence display comprising a pixel defining layer provided with an opening, a first electrode formed on the opening of the pixel defining layer in a recessed structure, an insulating layer provided with an opening for exposing a portion of the first electrode, an organic emission layer formed on the opening of the insulating layer, and a second electrode. The organic emission layer is formed to be recessed in the first electrode, so that the first electrode surrounds the organic emission layer.

The present invention also discloses an organic electroluminescence display comprising a thin film transistor, an insulating layer covering the thin film transistor and provided with a recessed portion having a recessed depth, a first electrode formed to cover the recessed portion of the insulating layer and electrically connected to the thin film transistor, and a second electrode. An organic layer is interposed between the first and second electrodes, having an emission layer, and disposed on a bottom of the recessed portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1:
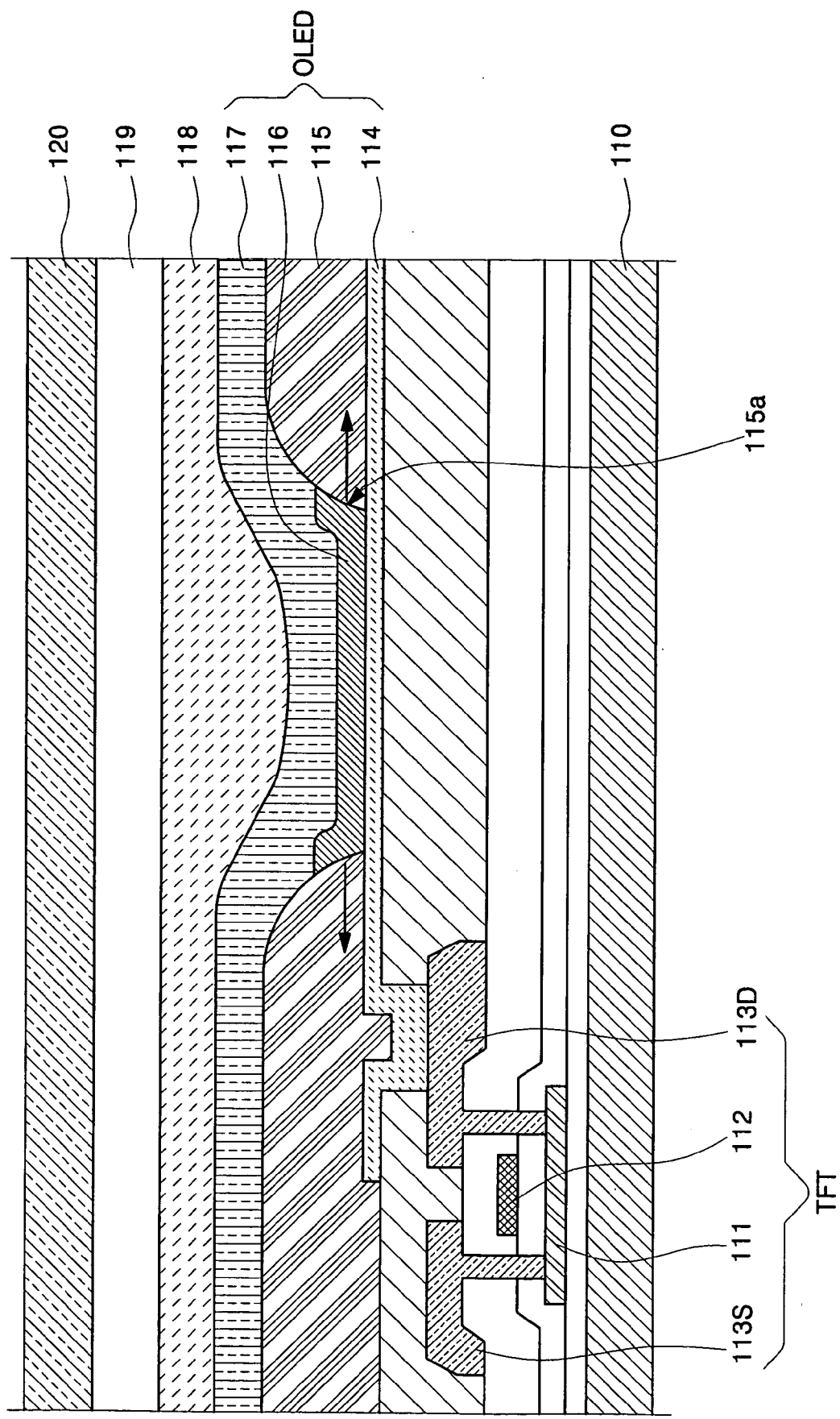
FIG. 1 shows a cross-sectional view of a conventional organic electroluminescence display.
Figure 2:
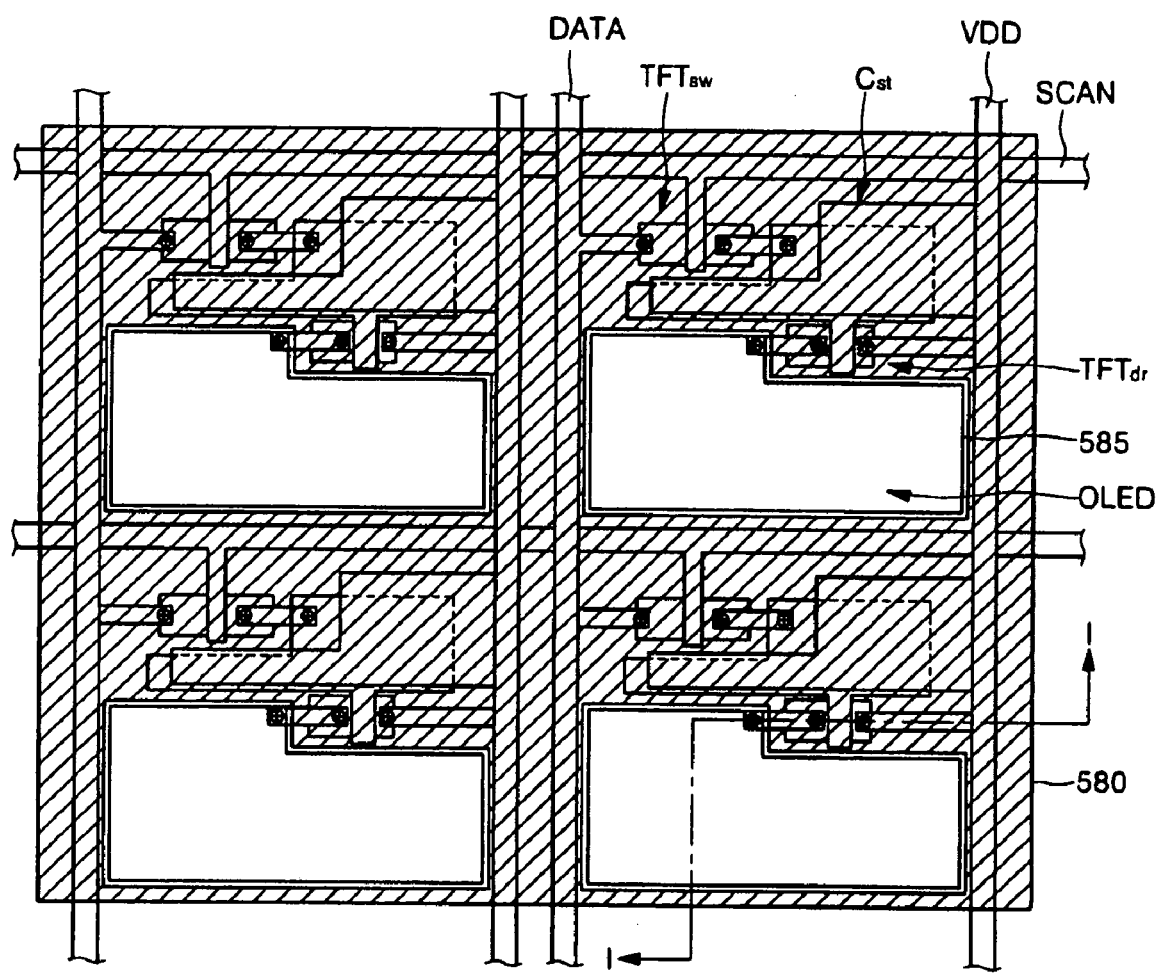
FIG. 2 is a plan view that shows an organic electroluminescence display in accordance with an exemplary embodiment of the present invention.

FIG. 2 is a plan view that shows a pixel portion of an active matrix organic electroluminescence display in accordance with an exemplary embodiment of the present invention.

Referring to FIG. 2, the organic electroluminescence display according to an exemplary embodiment of the present invention has a plurality of pixels. A single pixel, or a unit pixel, is surrounded by a scan line SCAN, a data line DATA and a power supply line or driving line VDD. Each pixel may comprise at least one switching TFT (TFTsw) for switching the pixel, one driving TFT (TFTdr) for driving the pixel, one capacitor Cst and one OLED. More TFTs and capacitors may be used for each pixel.

The switching TFT TFTsw is driven by a scanning signal applied to the scan line SCAN and transmits a data signal intended to be applied to the data line DATA. The driving TFT TFTdr determines the amount of current introduced through the driving line VDD into the OLED, according to the data signal transmitted through the switching TFT TFTsw, which is determined by a voltage difference Vgs between a gate and a source. The capacitor Cst stores the data signal transmitted through the switching TFT TFTsw for a time period of one frame.

A recessed portion 585 and a planarization layer 580 will be discussed subsequently.

[First Exemplary Embodiment]

Figure 3:
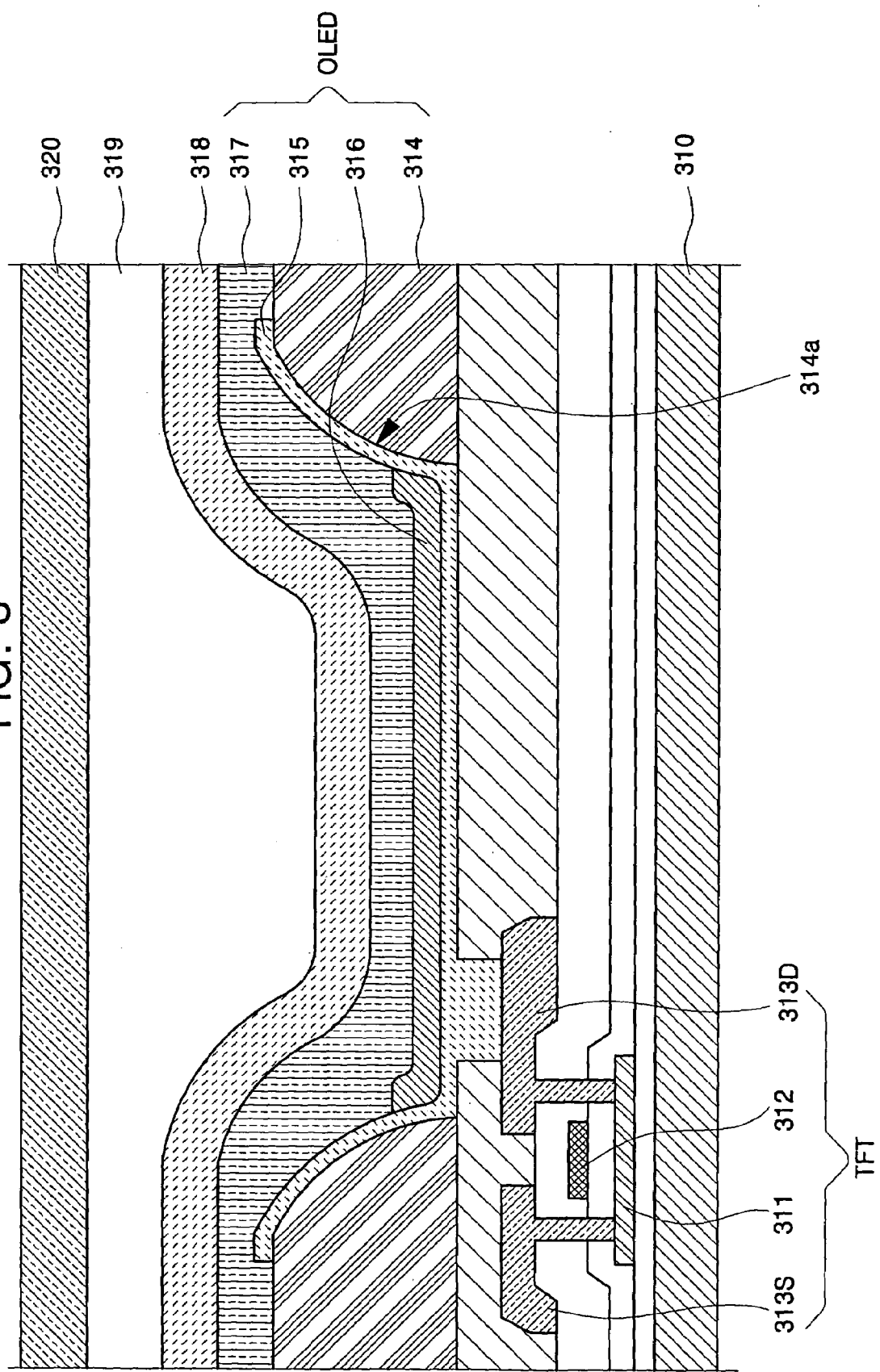
FIG. 3 shows an organic electroluminescence display according to a first exemplary embodiment of the present invention.

FIG. 3 shows an organic electroluminescence display according to a first exemplary embodiment of the present invention.

As shown in FIG. 3, a first electrode 315 is formed in a recessed structure in an opening of a pixel defining layer 314. An organic emission layer 316 is formed on the first electrode 315, and a second electrode 317 is formed on the entire surface of the substrate. The organic emission layer 316 is recessed on the first electrode 315, and the first electrode 315 surrounds the organic emission layer 316.

The first electrode 315 is formed in the opening of the pixel defining layer 314 so that a portion of the first electrode is higher than an upper surface of a flat region of the second electrode 317. Thus, light that is reflected laterally at the interface of the second electrode 317 and the passivation layer 318 is in turn reflected upward by the first electrode 315.

The lower insulating substrate 310 has a TFT composed of an active layer 311, a gate electrode 312 and source/drain electrodes 313S and 313D. The pixel defining layer 314 is formed in a recessed structure on the substrate in order to define an OLED pixel region in the upward direction. The pixel defining layer 314 is etched so that the opening 314$a$ is formed, which exposes any one of the source/drain electrodes 313S and 313D. The pixel defining layer 314 forms the OLED in the recessed structure as seen from the upward direction.

Preferably, the pixel defining layer 314 has a thickness between about 200 nm to about 10 μm, and the opening 314$a$ has a tapered angle between about 15° and about 70°. Further, the pixel defining layer 314 is preferably made of silicon oxide, silicon nitride, BCB (benzocyclobutene), acrylic-based curable resin, phenolic-based curable resin, polyamide (PI), ormocer or other like substances.

After forming the pixel defining layer 314, the first electrode 315 is formed in the recessed structure to electrically couple with the TFT. The first electrode 315 is preferably formed up to and on a portion of a flat upper region of the pixel defining layer 314, so that the first electrode 315 is higher than an interface between a space 319 and a transparent passivation layer 318 (i.e. the point where light emitted from the organic layer may be reflected).

The first electrode 315 upwardly reflects light generated at the organic emission layer, and, as noted above, it may also upwardly reflect light that is reflected laterally by the second electrode 317 or the transparent passivation layer 318.

When the first electrode 315 acts as anode, it may be formed by depositing and patterning a metal having a relatively high work function such as Al, Ag, Ni, Pt, Pd, or other like material. Alternatively, it may be formed by depositing any one of Al, Cr, Mo, Ti, Ta and their alloy, or other like material, and then depositing a transparent conductive material made of ITO, IZO, or other like material, and finally patterning the deposited result.

Conversely, when the first electrode 315 acts as cathode, it may be formed by depositing and patterning a metal having a relatively low work function such as Al, Ca, Mg, or other like material.

The organic emission layer 316 is formed on the first electrode 315, and it is generally formed in a multi-layer structure that is composed of at least one of a hole injecting layer (HIL), a hole transporting layer (HTL), a hole blocking layer (HBL), an electron transporting layer (ETL) and an electron injecting layer (EIL), including an emission layer.

The organic emission layer 316 is formed in an emission region and recessed in the first electrode 315, and it is surrounded by the first electrode 315.

The transparent second electrode 317 is then formed on the entire surface of the substrate, thereby completing the OLED. The OLED comprises the pixel defining layer 314, the first electrode 315, the organic emission layer 316 and the second electrode 317 and has a recessed structure as illustrated in FIG. 3.

A portion of the second electrode 317 in the emission region is preferably formed to have an upper surface of a flat region at a lower position than a portion of the first electrode 315. This formation may allow the first electrode 315 to upwardly reflect light that was previously reflected laterally due to its failure to transmit the second electrode 317.

When acting as anode, the second electrode 317 may be formed of a material having a relatively lower work function than the anode electrode. Preferably, the second electrode 317 is formed at a thin thickness with Mg-Ag, Ag, Mg, Ca, Al, Ba, or other like material, so as to transmit the light emitted from the organic emission layer 316 as well as the light reflected from the portion of the first electrode 315 positioned under the organic emission layer.

Alternatively, the second electrode 317 is formed by depositing and patterning a transparent conductive material having a relatively high work function such as ITO, IZO, or other like material.

The passivation layer 318 is then formed on the entire surface of the substrate. Like the second electrode 317, a portion of the passivation layer 318 in the emission region is preferably formed to have an upper surface of a flat region at a lower position than a portion of the first electrode 315.

Further, the passivation layer 318 may be formed with an inorganic material having a refractive index between about 1.4 and about 2.4, and preferably of a material having a small difference in refractive index as compared to the material forming the second electrode 317.

An upper insulating substrate 320 is then formed to encapsulate the lower insulating substrate 310 having the TFT and the OLED.

A reference numeral 319 indicates a space between the passivation layer 318 and upper insulating substrate 320 or an organic layer formed on the passivation layer 318.

The space 319 between the passivation layer 318 and upper insulating substrate 320 may be filled with a gas such as nitrogen ($N_2$) or argon (Ar), or it may be a vacuum.

The organic layer 319 formed on the passivation layer 318 is preferably formed with a material having a small difference in refractive index as compared to the material forming the passivation layer 318. The organic material may have a refractive index of refraction between about 1.1 and about 1.6 so that reflection at the interface between the passivation layer 318 and the space 319 may be reduced.

When the OLED described above is powered, holes injected through the anode and electrons injected through the cathode, combine at the organic emission layer in order to emit light. The light emitted from the organic emission layer transmits through the second electrode. However, at least 25% of the light coming from the organic emission layer may be reflected laterally due to the total reflection generated at the interface between the passivation layer and the organic layer, or between the passivation layer and the space filled with the nitrogen gas.

The total reflection occurs at an interface or a boundary surface between dense media and rare media when a light ray travels from the dense media to the rare media and when a difference between the refractive index of the dense media and the refractive index of the rare media is great.

The total reflection is generated when the incident angle of the light ray is greater than the critical angle. Here, the critical angel is expressed as follows:

$$\sin \theta = 1/n_{1,2} = n_1/n_2$$

where $n_{1,2}$ is the ratio of the refractive index of the dense media to the refractive index of the rare media, $n_1$ is the refractive index of the rare media, and $n_2$ is the refractive index of the dense media.

In other words, as the difference between the refractive indecies for the dense media and for the rare media increases, the critical angel for the total reflection decreases, increasing the total reflection.

Therefore, in the organic electroluminescence display having the OLED of the recessed structure in accordance with an exemplary embodiment of the present invention, the passivation layer and the organic layer are formed of a material having a similar refractive index, thereby reducing the total reflection. Further, light reflected laterally may be subsequently reflected upward by the first electrode.

While this exemplary embodiment has been described and illustrated with a transparent passivation layer, such a layer structure is not required. In an organic electroluminescence display without a transparent passivation layer, the flat upper surface of the second electrode may be arranged at a position lower than a portion of the first electrode so that the total reflection occurs at the interface between the transparent second electrode and the air.

In other words, a portion of the first electrode is preferably formed higher than a point where the total reflection occurs.

[Second Exemplary Embodiment]

Figure 4:
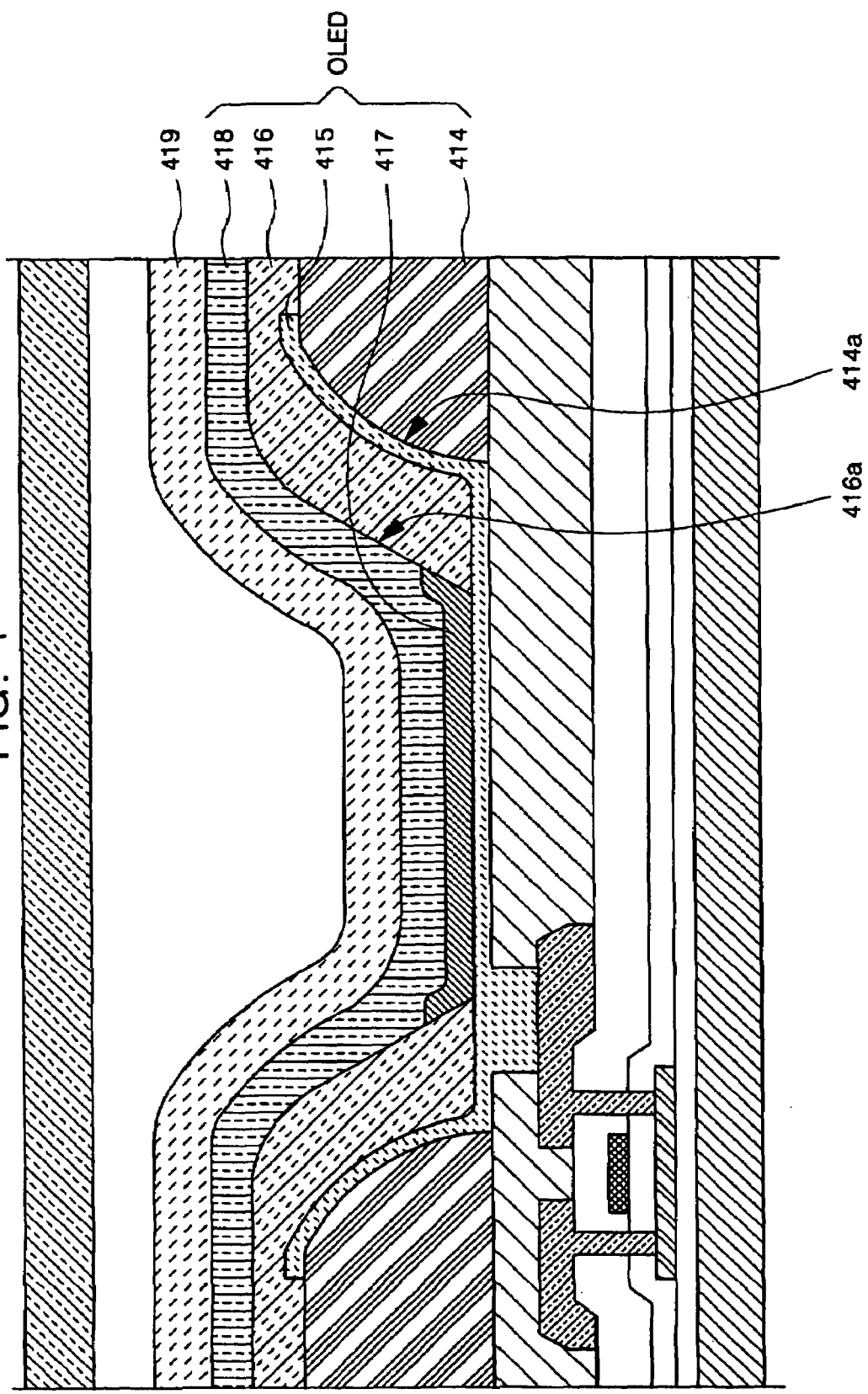
FIG. 4 shows an organic electroluminescence display according to a second exemplary embodiment of the present invention.

FIG. 4 shows an organic electroluminescence display according to a second exemplary embodiment of the present invention.

The organic electroluminescence display shown in FIG. 4 is similar in structure to the first exemplary embodiment, except for an insulating layer 416 provided with an opening 416a for exposing a portion of a flat region of a first electrode 415.

As shown in FIG. 4, the organic electroluminescence display according to the second exemplary embodiment includes a pixel defining layer 414, a first electrode 415, an insulating layer 416 having an opening 416a exposing a portion of the first electrode 415, an organic emission layer 417 formed on a portion of the first electrode 415 in the opening 416a, and a second electrode 418. The first electrode 415 surrounds the organic emission layer 417.

Therefore, like the first exemplary embodiment, the organic electroluminescence display according to the second exemplary embodiment may transmit light in an upward direction and upwardly reflect light that was previously laterally reflected.

Additionally, the insulating layer 416 is preferably thinner than the pixel defining layer 414, and, more preferably, it has a thickness between about 200 nm and about 3 µm.

The opening 416a is preferably formed with a tapered angle smaller than the opening 414a, and, more preferably, the opening 416a has a tapered angle between about 15 to about 60°. Additionally, the insulating layer 416 may be formed of silicon oxide, silicon nitride, BCB (benzo-cyclo-butene), acrylic-based curable resin, phenolic-based curable resin, polyimide, ormocer or other like material.

[Third Exemplary Embodiment]

Figure 5A:
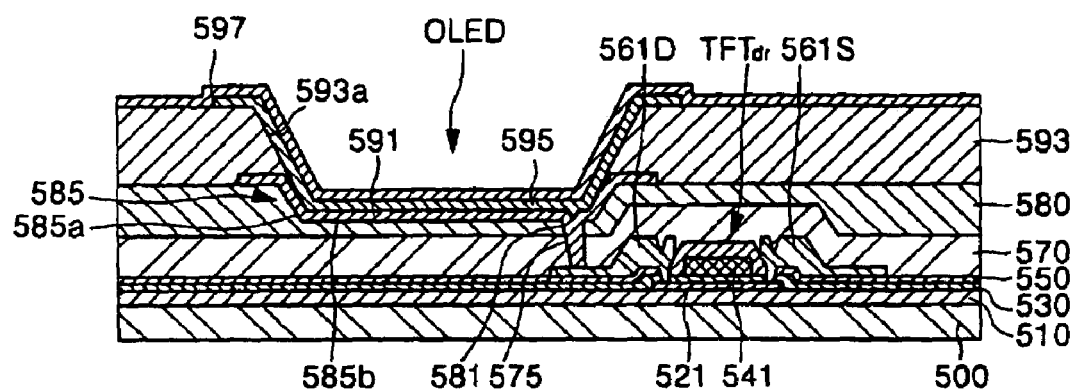
FIG. 5A and FIG. 5B show an organic electroluminescence display according to a third exemplary embodiment of the present invention.
Figure 5B:
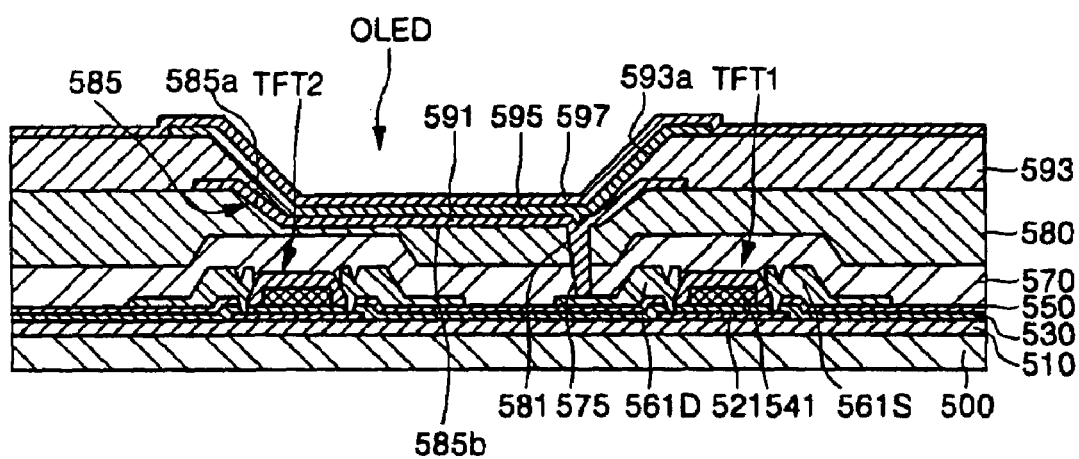

FIGS. 5A and 5B show an organic electroluminescence display according to a third exemplary embodiment of the present invention. FIG. 2 shows a plan view of this exemplary embodiment.

FIG. 2 provides a switching TFT TFTsw, a driving TFT TFTdr, a capacitor Cst and an OLED. The following description discusses the structure of the driving TFT TFTdr, but the switching TFT TFTsw has the same structure. In FIG. 5A, a buffer layer 510, comprising a material such as SiO2, is formed on an insulating substrate 500, which may be formed of transparent glass. Alternatively, a plastic material may be used for the insulating substrate 500. If the insulating substrate 500 is formed of glass, the buffer layer 510 is formed on the substrate 500, thus preventing impurities from being transmitted and providing a flat surface. The buffer layer 510 can be deposited by PECVD (Plasma Enhanced Chemical Vapor Deposition), APCVD (Atmospheric Pressure Chemical Vapor Deposition), LPCVD (Low Pressure Chemical Vapor Deposition), ECR (Electron Cyclotron Resonance), or other similar processes. Further, the buffer layer 510 may be deposited at a thickness of about 3000 Å.

The driving TFT TFTdr comprises a semiconductor active layer 521 formed on the buffer layer 510, a gate insulating layer 530 formed on the semiconductor active layer 521, a gate electrode 541 formed on the gate insulating layer 530, and source/drain electrodes 561 S and 561D contacting the semiconductor active layer 521.

The semiconductor active layer 521 may be formed of an inorganic or organic semiconductor material at a thickness of about 500 Å. It may be formed of poly-silicon by crystallizing amorphous silicon utilizing any one of various kinds of crystallization techniques. The semiconductor active layer 521 has source and drain regions into which an N-type or P-type dopant is doped at a high concentration, and a channel region formed between the source and drain regions.

The inorganic semiconductor materials may include CdS, GaS, ZnS, CdSe, CaSe, ZnSe, CdTe, SiC and silicon such as a-Si (amorphous silicon) or poly-Si (poly-silicon).

The organic semiconductor materials may include a semiconductive organic material having a band gap between 1 and 4 eV, high molecular (polymer) materials, and low molecular materials. The polymer materials are exemplified by polythiophene and its derivative, polyparaphenylenvinylene and its derivative, polyparaphenylen and its derivative, polypropylene and its derivative, polythiophenevinylene and its derivative, and polythiophene-hetrocyclic aromatic copolymer and its derivative. The low molecular materials are exemplified by oligoacenes (pentacene, tetracene, anthracene and naphthalene) and their derivative, oligothiophenes (α-6-thiophene, α-5-thiophene) and their derivative, phthalocyanine with or without containing a metal and its derivative, pyromellitic dianhydride or pyromellitic diimide and its derivative, and perylenetetracarboxylic dianhydride or perylenetetracarboxylic diimide and its derivative.

The gate insulating layer 530 is formed on the semiconductor active layer 521, and it may be formed with $SiO_2$. The gate electrode 541 is formed on a predetermined region of an upper portion of the gate insulating layer 530 with a layer of a conductive metal such as MoW, Al, Cr, Al/Cu, or other like material. Various kinds of conductive materials such as conductive polymers may be used for the gate electrode 541. The region for the gate electrode 541 corresponds to a channel region of the semiconductor active layer 521.

An interlayer insulating layer 550 is formed on the gate electrode 541 and the gate insulating layer 530, and it may be formed with $SiO_2$ and/or $SiN_x$. When a contact hole is formed in the interlayer insulating layer 550 and the gate insulating layer 530, the source and drain electrodes 561S and 561D are formed on the interlayer insulating layer 550. A layer made of either a conductive metal such as MoW, Al, Cr, Al/Cu, or other like material, or a conductive polymer, may be used to form the source and drain electrodes 561S and 561D.

A conventional TFT may also be used as the TFT structure of the present invention and is not limited to the structure described above.

A passivation layer 570 is formed of SiNx on the source and drain electrodes 561S and 561D, and a first via hole 575 is formed in the passivation layer 570.

A planarization layer 580 is formed on the passivation layer 570, and it may be formed of acryl, BCB (benzo-cyclo-butene), polyimide or other like material.

A second via hole 581 is formed in the planarization layer 580 so as to communicate with the first via hole 575 of the passivation layer 570. A first electrode 591, formed on the planarization layer 580, is electrically coupled to the source and drain electrodes 561S and 561D via the first and second via holes 575 and 581. A pixel defining layer 593 is formed on the first electrode 591, and it may be formed of acryl, BCB (benzo-cyclo-butene), polyimide, or other like material. The pixel defining layer 593 is provided with a predetermined opening 593a, and then an organic layer 595 and a second electrode 597 of the OLED are formed. Alternatively, the planarization layer 580 and the pixel defining layer 593 may be integrally formed. In this case, the first electrode 591 may be formed on the passivation layer 570.

As current flows, the OLED emits red, green and blue light to display predetermined image information. The OLED comprises the first electrode 591, the second electrode 597, and the organic layer 595.

The first and second electrodes 591 and 597 are spaced a predetermined distance apart from each other by the organic layer 595, and they apply voltages of different polarities to the organic layer 595, thereby causing light to be emitted from the organic layer 595.

A low or high molecular organic layer may be used for the organic layer 595. For the low molecular organic layer, HIL (Hole Injecting Layer), HTL (Hole Transporting Layer), EML (Emission Layer), ETL (Electron Transporting Layer), EIL (Electron Injecting Layer) and other like layers may be stacked in a single or composite structure. A variety of organic materials, such as CuPc (copper phthalocyanine), NPB (N,N-di(naphthalene-1-yl)-N,N'-diphenyl-benzidine), and Alq3 (tris-8-hydroxyquinoline aluminum) may be available. The low molecular organic layer may be formed by a vacuum deposition method or other like method.

Alternatively, when using a high molecular organic layer, in general, it has a structure with HTL and EML, in which the HTL is composed of PEDOT (polyethylenedioxythiophene) and the EML is composed of a high molecular organic material such as a PPV (polyphenlenevinylene) based organic material or polyfluorene based organic material. The high molecular organic layer is formed by a screen process, an ink-jet printing method or other similar process.

The organic layer is not limited as described above as it may be implemented by various means.

In the exemplary embodiment described below, the first electrode 591 functions as the anode electrode, while the second electrode 597 functions as the cathode electrode. However, the polarities of the first and second electrodes 591 and 597 may be reversed.

As an anode, the first electrode 591 may be a transparent electrode or a reflective electrode. If made as transparent electrode, the first electrode may be formed of ITO, IZO, ZnO, In$_2$O$_3$, or other like material. If made as reflective electrode, the first electrode may be formed of Ag, Mg, Al, Pt, Pd, Au, Ni, Nd, Ir, Cr, and their compounds for a reflective layer, and then ITO, IZO, ZnO, In$_2$O$_3$, or other like material, on the reflective layer.

As cathode, the second electrode 597 may also be a transparent electrode or a reflective electrode. If made a transparent electrode, a metal having a low work function such as Li, Ca, LiF/Ca, LiF/Al, Al, Mg or their compounds is deposited to face toward the organic layer 595, and then either an auxiliary electrode layer or a bus electrode line is formed of a material for the transparent electrode such as ITO, IZO, ZnO, In$_2$O$_3$, or other like material, on the deposited layer. If made a reflective electrode, the second electrode can be formed by overall deposition of Li, Ca, LiF/Ca, LiF/Al, Al, Mg or their compounds, or other like material.

The present invention may improve luminous efficiency by forming a recessed portion 585 recessed in the planarization layer 580 of FIG. 5A, where the first electrode 591 is formed at a predetermined depth.

As can be seen from FIG. 2, the recessed portion 585 has a smaller area than the entire sub-pixel, and it is provided on the region where the first electrode 591 is formed. As can be seen from FIG. 5A, the recessed portion 585 is recessed in the planarization layer 580 at a predetermined depth, and it has sides 585a and a bottom 585b. Each side 585a may be tapered in a certain extent as can be seen from FIG. 5A, but the side 585a is not limited to this configuration. For example, the side 585a may be formed in a perpendicular direction to the bottom 585b.

The first electrode 591 is formed to cover the recessed portion 585. The organic layer 595 is formed at least to be disposed on the bottom 585b of the recessed portion 585. In is this case, the first electrode 591 is also formed to cover the sides or edges 585a of the recessed portion 585.

The recessed portion 585 is formed in the planarization layer 580, and the first electrode 591 is disposed in the recessed portion 585. The light emitted from the organic layer 595, which is arranged to face the first and second electrodes 591 and 597, is reflected by the first electrode 591, so that the luminous efficiency can be improved. Thus, in order to increase a function of the recessed portion 585, the first electrode 591 is preferably made as a reflective electrode. In this case, the second electrode 597 is preferably made as a transparent electrode so that the image can be displayed toward the second electrode 597.

In order to allow the light emitted from the organic layer 595 to be reflected by the first electrode 591, the depth of the recessed portion 585 must be greater than the thickness of the organic layer 595 because the organic layer 595 is capable of reflecting the light emitted in a lateral direction. The organic layer should be thinner than the planarization layer 580 where the recessed portion 585 is formed.

The recessed portion 585 can be simultaneously formed together with the second via hole 581 using a half tone masking technique, when the second via hole 581 is formed in the planarization layer 580.

On the other hand, as noted above, the planarization layer 580 may be integrally formed with the pixel defining layer 593. In this case, the first electrode 591 may be formed on the passivation layer 570, and the recessed portion may be formed in the passivation layer 570 with the same area and depth as the recessed portion 585 formed in the planarization layer 580. The recessed portion formed in the passivation layer 570 may be formed at the same time when the first via hole 575 is formed.

A separate reflective layer (not shown) may be formed on the sides 585a of the recessed portion 585 except for the first electrode 591. In this case, the first electrode 591 may be made as a transparent electrode, and the second electrode 597 may made as a reflective electrode and used as a bottom-emitting electrode. When made as a transparent electrode, the second electrode 597 may be used as a double-emitting electrode.

As can be seen from FIG. 2, an exemplary embodiment of the present invention uses two TFTs. However, the present invention is not limited to that case, and two or more TFTs may be used for one pixel. In this event, an additional TFT is provided under the position where the OLED is formed, as can be seen from FIG. 5B.

Specifically, as shown in FIG. 5B, a first TFT TFT1 and a second TFT TFT2 are provided on the lower portion where the OLED is formed. The OLED is connected to any one of the first and second TFTs. In the figure, only two TFTs are shown, but two or more TFTs may be arranged in an actual planar structure.

In the organic electroluminescence display of this structure, the recessed portion 585 is formed in the planarization layer 580 as set forth above, so that it is possible to improve the luminous efficiency. The other detailed components of FIG. 5B are the same as those of FIG. 5A, so their description is omitted.

As set forth above, according to exemplary embodiments of the present invention, the organic electroluminescence display may improve the luminous efficiency and luminance by concentrating the light, which is emitted from the organic layer of the OLED, into the first electrode, and by reflecting and extracting the light that laterally reflects due to the total reflection at an interface between layers.

Further, the organic electroluminescence display may improve power consumption and life span by improving the luminous efficiency and luminance.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence display, comprising:
a pixel defining layer with an opening;
a first electrode formed on the opening of the pixel defining layer in a recessed structure;
an organic emission layer formed on the first electrode; and
a second electrode,
wherein the organic emission layer is formed to be recessed in the first electrode, so that the first electrode extends higher than the organic emission layer.

2. The organic electroluminescence display of claim 1, wherein the first electrode has a portion higher than an upper surface of a lowest portion of the second electrode in an emission region.

3. The organic electroluminescence display of claim 1, further comprising a passivation layer formed on the second electrode, wherein a lowest portion of the passivation layer in an emission region, is lower than a portion of the first electrode.

4. The organic electroluminescence display of claim 3, wherein the passivation layer has a refractive index between 1.4 and 2.4.

5. The organic electroluminescence display of claim 4, further comprising an organic layer formed on the passivation layer, wherein the organic emission layer has a refractive index between 1.1 and 1.6.

6. The organic electroluminescence display of claim 1, wherein the pixel defining layer has a thickness ranging from 200 nm to 10 μm.

7. The organic electroluminescence display of claim 1, wherein the opening of the pixel defining layer has a tapered angle between 15 degrees and 70 degrees.

8. The organic electroluminescence display of claim 1, wherein the pixel defining layer is formed of any one selected from a group consisting of silicon oxide, silicon nitride, BCB (benzocyclobutene), acrylic-based curable resin, phenolic-based curable resin, polyamide, and ormocer.

9. The organic electroluminescence display of claim 1, further comprising an insulating layer with an opening for exposing a portion of the first electrode.

10. The organic electroluminescence display of claim 9, wherein the insulating layer is formed of any one selected from a group consisting of silicon oxide, silicon nitride, BCB (benzocyclobutene), acrylic-based curable resin, phenolic-based curable resin, polyamide, and ormocer.

11. The organic electroluminescence display of claim 10, wherein the insulating layer has a thickness ranging from 200 nm to 3 μm.

12. The organic electroluminescence display of claim 10, wherein the opening of the insulating layer has a tapered angle between 15 and 60 degrees.

13. The organic electroluminescence display of claim 9, wherein the insulating layer is thinner than the pixel defining layer, and the opening of the insulating layer has a tapered angle smaller than that of the opening of the pixel defining layer.

14. An organic electroluminescence display, comprising:

a pixel defining layer with a first opening;

a first electrode formed in the first opening in a recessed structure;

an insulating layer with a second opening that exposes a portion of the first electrode, the second opening being arranged within the first opening;

an organic emission layer formed in the second opening and on the first electrode; and a second electrode, wherein the first electrode extends higher than the organic emission layer.

15. The organic electroluminescence display of claim 14, wherein the insulating layer is formed of any one selected from the group consisting of silicon oxide, silicon nitride, BCB (benzocyclobutene), acrylic-based curable resin, phenolic-based curable resin, polyamide, and ormocer.

16. The organic electroluminescence display of claim 15, wherein the insulating layer has a thickness ranging from 200 nm to 3 μm.

17. The organic electroluminescence display of claim 15, wherein the opening of the insulating layer has a tapered angle between 15 and 60 degrees.

18. The organic electroluminescence display of claim 14, wherein the insulating layer is thinner than the pixel defining layer, and the second opening has a tapered angle smaller than that of the first opening.

19. The organic electroluminescence display of claim 14, wherein the first electrode has a portion higher than an upper surface of a lowest portion of the second electrode in an emission region.

20. The organic electroluminescence display of claim 14, futher comprising a passivation layer formed on the second electrode, wherein a lowest portion of the passivation layer in an emission region is lower than a portion of the first electrode.

* * * * *